(12) United States Patent
Kouzuma et al.

(10) Patent No.: US 8,092,637 B2
(45) Date of Patent: Jan. 10, 2012

(54) MANUFACTURING METHOD IN PLASMA PROCESSING APPARATUS

(75) Inventors: Yutaka Kouzuma, Kudamatsu (JP); Yutaka Ohmoto, Hikari (JP); Mamoru Yakushiji, Shunan (JP); Ken Yoshioka, Hikari (JP); Tsunehiko Tsubone, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 929 days.

(21) Appl. No.: 12/038,841

(22) Filed: Feb. 28, 2008

(65) Prior Publication Data

US 2009/0218316 A1 Sep. 3, 2009

(51) Int. Cl.
*C23F 1/00* (2006.01)
*H01L 21/306* (2006.01)
(52) U.S. Cl. ......... 156/345.24; 156/345.27; 156/345.51; 156/345.52
(58) Field of Classification Search ........................ None
See application file for complete search history.

(56) References Cited

U.S. PATENT DOCUMENTS

| 6,616,767 | B2 * | 9/2003 | Zhao et al. | 219/121.52 |
| 2007/0181065 | A1 * | 8/2007 | Otaka et al. | 118/725 |
| 2008/0066683 | A1 * | 3/2008 | Fujimura et al. | 118/724 |

FOREIGN PATENT DOCUMENTS

| JP | 2-56443 | 4/1990 |
| JP | 6-290917 | 10/1994 |
| JP | 7-220862 | 8/1995 |
| JP | 11-162620 | 6/1999 |

* cited by examiner

*Primary Examiner* — Duy Deo
(74) *Attorney, Agent, or Firm* — Antonelli, Terry, Stout & Kraus, LLP.

(57) ABSTRACT

A manufacturing method includes steps of: placing a film composed of dielectric, on the top surface of a sample stage, forming a film-like heater on the film made of the dielectric, supplying power to the heater to detect a temperature distribution, adjusting a resistance value of the heater on the basis of a result of detection of a temperature distribution so that the temperature distribution has a predetermined value, and then forming the film composed of the dielectric, on the heater.

8 Claims, 4 Drawing Sheets

MANUFACTURING METHOD IN PLASMA PROCESSING APPARATUS

BACKGROUND OF THE INVENTION

The present invention relates to a manufacturing method in a plasma processing apparatus that holds a substrate-like sample such as a semiconductor wafer on a sample stage located in a processing chamber inside a vacuum chamber to process the sample using plasma formed in the processing chamber, and in particular, to a manufacturing method in a plasma processing apparatus which comprises heaters inside a film of a dielectric material on a top surface of the sample stage and which executes plasma processing while adjusting the temperature of the sample through the operation of the heaters.

In recent years, with miniaturized and complicated semiconductor devices, there has been a great demand for batch etching of multilayer films by means of a single etching processing apparatus using plasma, in a preprocess and a postprocess for a semiconductor manufacturing process. In the batch etching, for each film type, etching uniformity needs to be maintained within a wafer surface, and etching shape needs to be appropriately maintained. Each film type has a suitable wafer temperature and radial temperature distribution. Thus, there has been a requirement that every time the film type to be etched is changed, the temperature value and distribution of a sample be quickly and accurately changed.

A proposed technique for implementing this places film-like heaters inside a film composed of a dielectric material and located on a top surface of a sample stage holding a substrate-like sample such as a semiconductor wafer. The technique then executes a process of etching the sample while using the heaters to heat the sample to obtain the desired temperature distribution of the wafer. Advantageously, such a technique using the heaters located adjacent to the sample enables the temperature and temperature distribution of the sample to be quickly changed, and the technique further allows the temperature value to be sufficiently changed even with low heat input from plasma.

A known sample stage containing heaters uses ceramic heaters embedded inside a film of ceramics, which is resistant to heat and corrosion caused by a corrosive gas. As described in JP-UM-A-2-56443, a method for manufacturing such a ceramic heater prepares a ceramic green sheet with a heat resistant film printed thereon in a predetermined shape. The method then laminates a second ceramic green sheet on the first ceramic green sheet to produce a ceramic laminate, and then integrally burns the laminate.

Furthermore, JP-A-7-220862 discloses a method of filling ceramic powder in a mold, performs pressing to form a burned ceramic member having a recess, and arranging heaters in the recess in a predetermined pattern shape; the heaters are each shaped like a coil spring obtained by rolling a wire of a high-melting-point metal. The method then fills the ceramic power into the recess to produce a disc-like compact and subjects the compact to hot pressing. Moreover, JP-A-11-162620 discloses a method of preparing ceramic heaters each made up of a heater electrode embedded in a ceramic base, allowing the heaters to generate heat, measuring the temperature distribution of surfaces of the heaters, and cutting a surface of each of the heaters other than the heating surface which corresponds to a low temperature portion, for example, a back surface, on the basis of the temperature distribution to partly form a thinner portion.

Furthermore, the use of a film obtained by a spray coating method as the dielectric film has hitherto been known; the film is obtained by spraying particles of a material melted at high temperatures using plasma or the like, against a surface of an object. For example, JP-A-6-290917 describes a method of engraving a groove corresponding to a pattern in a surface of a base, forming a lower film, an insulator film, and a heater film by means of spray coating using plasma, and then polishing the base so that the heater film remain inside the groove.

SUMMARY OF THE INVENTION

It is necessary to reduce possible errors in the temperature distribution of the temperature of the dielectric film on the sample stage with the built-in heaters, that is, to minimize a difference between the desired temperature distribution and the actual temperature distribution of the surface of the dielectric film as possible. For example, for an etching process using a substantially circular semiconductor wafer as a sample, the temperature value and distribution of the wafer temperature in a radial direction from the center thereof vary depending on conditions required for the process; in some cases, what is called a center-high distribution is required in which the temperature is higher in the center of the wafer and lower on an outer peripheral side thereof, in some cases, an outer-high distribution is required in which the temperature is higher on the outer peripheral side, and in the other cases, the temperature has a fixed value. On the other hand, a general requirement is that the temperature distribution in a circumferential direction be such that the temperature value is as constant as possible, that is, the temperature be made precisely uniform in the circumferential direction.

In connection with this requirement, the technique in JP-UM-A-2-56443 disadvantageously fails to increase the accuracy of the temperature distribution of the heating surface owing to a variation in printing of a heat resistant film. Furthermore, the technique in JP-A-7-220862 fails to increase the accuracy of the temperature distribution owing to the difficulty of keeping the shape and pitch of the coil spring constant. That is, heater electrodes manufactured by the methods in JP-UM-A-2-56443 and JP-A-7-220862 cannot provide an accurate temperature distribution on a wafer. This disadvantageously prevents the film from being formed to have a uniform thickness or etched to a uniform depth, thereby reducing the yield of products.

Furthermore, the method in JP-A-11-162620 cuts the ceramic base to control the quantity of heat generated, enabling an increase in the accuracy of the temperature distribution compared to the related art. However, this method does not directly control the quantity of heat generated by the heat resistor, located inside the ceramic base. This disadvantageously requires cutting of the dense ceramic base, resulting in the need for a long time to increase the accuracy of the temperature distribution of the heating surface. This in turn results in an increase in manufacturing costs. Moreover, with the method in JP-A-6-290917, a spray coated film is difficult to reproduce, making it difficult to always control the resistivity of the film to a fixed value. Precisely improving heat uniformity is thus difficult.

Additionally, with the related arts described above, the accuracy of the temperature distribution may be reduced by the nonuniform distribution of the heat generation quantity resulting from the structure of the sample stage, on which the wafer is placed, for example, the periphery of a wafer removing lift pin located on the sample stage or an introduction portion for a heat transferring gas fed to between the back surface of the wafer and the top surface of the sample stage in order to cool the wafer. The accuracy of the temperature distribution may also be reduced by an external factor such as a heat exhaust distribution or a plasma heat input distribution during an etching process. It is difficult to compensate for these reductions at the stage of manufacturing the plasma processing apparatus or the sample stage.

An object of the present invention is to provide a manufacturing method in a plasma processing apparatus which enables a sample stage to be inexpensively manufactured. Another object of the present invention is to provide a manufacturing method in a plasma processing apparatus which allows the temperature of the surface of the sample placed on the sample stage to be accurately adjusted.

This object is accomplished by a manufacturing method in a plasma processing apparatus comprising a sample stage located in a processing chamber in which plasma is formed, the sample stage having a wafer placed on a top surface thereof, a film made of a dielectric and located on the top surface of the sample stage on which the wafer is placed, and a film-like heater arranged inside the film made of the dielectric, the plasma processing apparatus executing plasma processing while using the heater to heat the wafer placed on the sample stage, the method comprising placing the film comprising the dielectric, on the top surface of the sample stage, forming the film-like heater on the film made of the dielectric, supplying power to the heater to detect a temperature distribution, adjusting a resistance value of the heater on the basis of a result of detection of a temperature distribution so that the temperature distribution has a predetermined value, and then forming the film comprising the dielectric, on the heater.

The temperature distribution is obtained by detection using a noncontact surface thermometer. The temperature distribution is also obtained by varying a shape of the heater to adjust a resistance value of the heater. The temperature distribution is also obtained by reducing a cross section of the heater corresponding to a low temperature portion of the temperature distribution to adjust the resistance value of the heater.

Furthermore, the temperature distribution is obtained by increasing a cross section of the heater corresponding to a high temperature portion of the temperature distribution to adjust the resistance value of the heater.

Moreover, the temperature distribution is obtained by dividing the heater into at least three areas in a circumferential direction of the surface on which the wafer is placed, detecting a distribution of the resistance value of the heater, and adjusting the resistance value of the heater for each of the areas.

Moreover, the temperature distribution is obtained by adjusting the resistance value on the basis of an average temperature distribution of each of the areas.

Other objects, features and advantages of the invention will become apparent from the following description of the embodiments of the invention taken in conjunction with the accompanying drawings.

DETAILED DESCRIPTION OF THE EMBODIMENT

An embodiment of the present invention will be described with reference to the drawings.

A spray coated film heater according to the present embodiment described below is embedded inside a dielectric made of ceramics or a spray coated film and located on an electrode main body on which a wafer is placed. The spray coated film heater is divided into at least two pieces in a radial direction. Furthermore, the present invention is characterized in that each of the resulting heaters is further divided into at least three blocks in a circumferential direction which blocks are connected in series.

According to a process of manufacturing a wafer placing electrode according to the present embodiment, in a step of producing a film heater by spray coating, the temperature distribution of the spray coated film heaters is measured with an infrared emission thermometer. The measured heat generation distribution is divided into blocks the number of which is equal to or larger than the same as that of the spray coated film heaters resulting from the division. The average temperature distribution in a circumferential direction is thus determined. The resistance of the spray coated film heater is then adjusted to a predetermined value so as to control a decrease in the temperature accuracy attributed to the heat generation distribution of the heaters but also a decrease in temperature accuracy associated with the structure of the wafer placing electrode or an external factor such as a plasma heat input distribution. This improves the heat uniformity of the wafer placed on the dielectric film.

The embodiment of the present invention will be described with reference to FIGS. 1 to 5.

Figure 6:
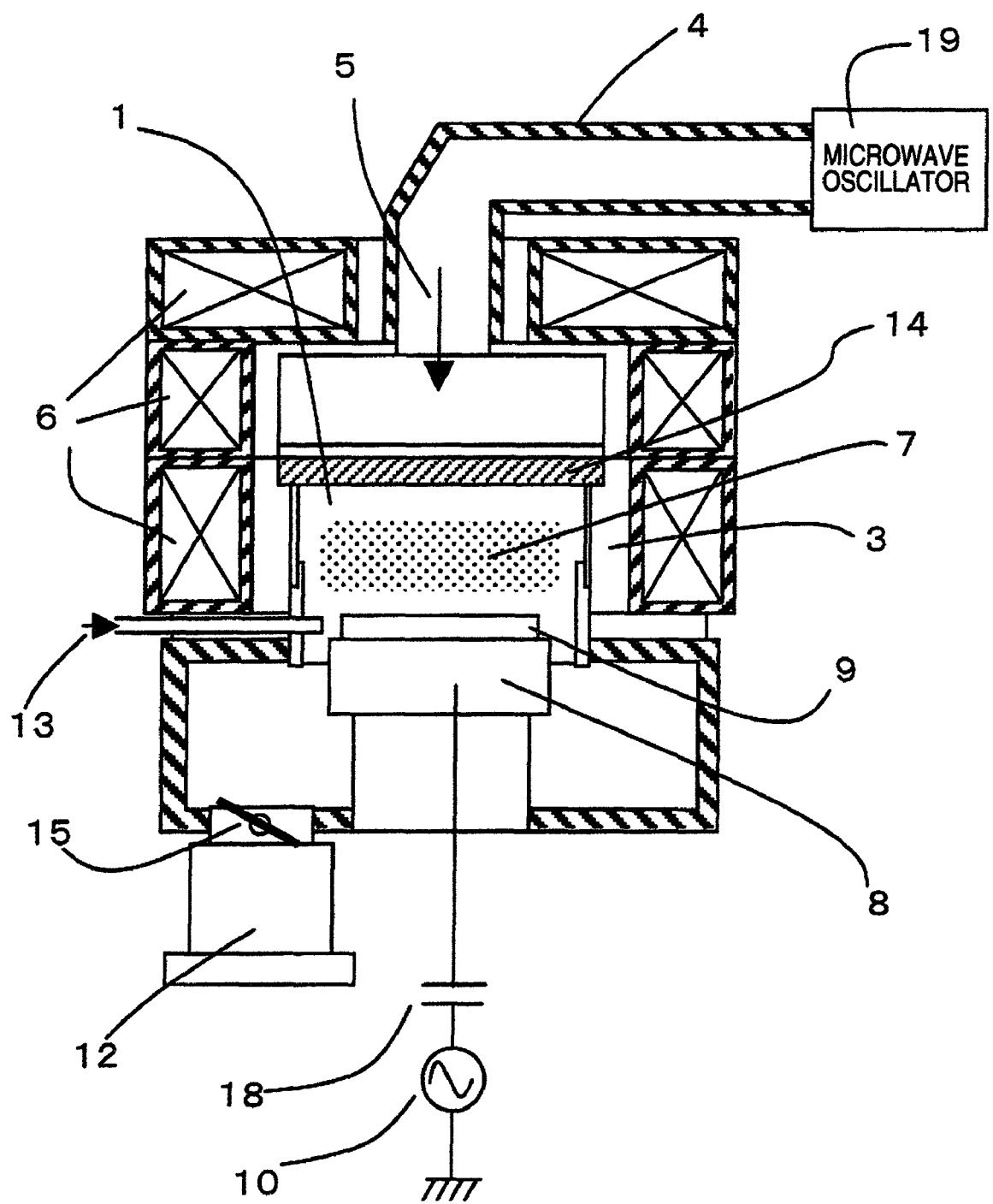
FIG. 6 is a vertically sectional view schematically showing the configuration of a plasma processing apparatus according to the embodiment of the present invention.

First, a magnetic-field-generating microwave plasma processing apparatus according to the embodiment will be described with reference to FIG. 6. FIG. 6 is a vertically sectional view schematically showing the configuration of the plasma processing apparatus according to the embodiment of the present invention.

The plasma processing apparatus etches a substrate-like sample to be processed which is located inside a processing chamber in a vacuum chamber, using plasma formed in the processing chamber. In FIG. 6, a processing target wafer 9 is fixed to a wafer placing top surface of a sample stage 8 in a vacuum chamber 1 by means of a static electricity force using an electrostatic chuck located inside the sample stage 8. A quartz window 14 is installed on the vacuum chamber 3, which is a vacuum container. A microwave 5 generated by a microwave oscillator 19 is introduced into the vacuum processing chamber 1, located inside the vacuum chamber 3, through a waveguide 4.

A process gas 13 introduced into the vacuum processing chamber 1 is in a plasma 7 state as a result of the interaction between the microwave 5 and a magnetic field generated by a coil 6 attached to the periphery of the vacuum chamber 3. Processing (in this case, an etching process) is executed by exposing a wafer to the plasma. An etching condition is controlled by an ion-energy-controlling high-frequency power source 10 connected to a conductive base 2 via a capacitor 18 to control the incidence of ions. The frequency of the high-frequency power source 10 is, for example, 400 KHz.

A vacuum pump 12 is located below the vacuum chamber 3 and is in communication with an opening located in a bottom surface of the vacuum chamber 3. By adjusting the aperture of an opening in a rotating valve 15, the pressure in the processing chamber 1 is kept constant. In the present embodiment, the sample stage 8 has built-in heaters as described below, and the heaters are supplied with DC power by a heater power source (not shown).

Figure 1:
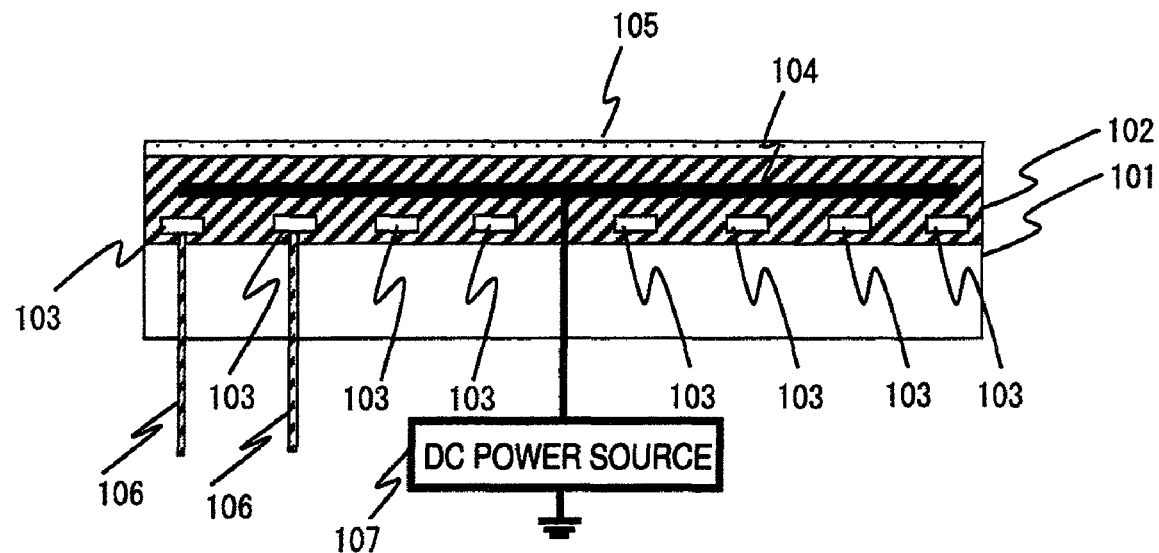
FIG. 1 is a vertically sectional view schematically showing the configuration of a sample stage according to an embodiment of the present invention.

FIG. 1 shows a wafer stage (holder) having an electrode therein (hereinafter referred to as a wafer stage) and used in a semiconductor manufacturing process in order to hold a wafer and to adjust the temperature of the wafer. The wafer stage is an embodiment of a spray coated film heater according to the present invention. In FIG. 1, reference numeral 101 denotes the wafer stage corresponding to the sample stage 8, shown in FIG. 1 and constituting an electrode main body. Reference numeral 102 denotes a high-resistance dielectric film. Reference numeral 103 denotes a heater embedded inside a high-resistance dielectric film 102 and made up of a spray coated film. Reference numeral 104 denotes an electric feeding layer allowing the wafer to be sucked. Reference numeral 105 denotes a wafer that is a processing target substrate. Reference numeral 106 denotes a heater energizing electric feeding terminal provided opposite a surface to which the wafer 104 as the processing target substrate is sucked. Reference numeral 107 denotes a DC power source that allows a spray coated film to exert an electrostatic attraction force. Here, the wafer stage shown in FIG. 1 is installed inside an etching apparatus.

The present embodiment is characterized in that a material constituting the high-resistance dielectric film 102 includes $Al_2O_2$ or $Y_2O_3$. A material constituting the spray coated film heater 103 may be a resistance heating element that can be formed by spray coating using W, a nickel chrome alloy, or a nickel aluminum alloy. The high-resistance dielectric film 102 need not be formed by spray coating but may be a sintered member provided that the spray coated film heater 103 is embedded in the film 102.

The spray coated film heater 103, formed by spray coating, is divided into at least two pieces in a radial direction in order to precisely change a temperature distribution in the radial direction. The resulting spray coated film heaters 103 are densely arranged inside the high-resistance dielectric film 102 so as to cover almost an entire surface of thereof. Furthermore, each of the heaters is divided into at least three areas or blocks in order to adjust the circumferential temperature distribution. The blocks are connected in series. The spray coated film heater 103 according to the present embodiment is also characterized in that in the stage of manufacture of a heater layer, the temperature distribution of the spray coated film heaters 103 is measured with an infrared emission thermometer, and in that the resistance value of each spray coated film heater 103 is directly controlled on the basis of the temperature distribution to improve the heat uniformity of the heater 103.

Figure 2:
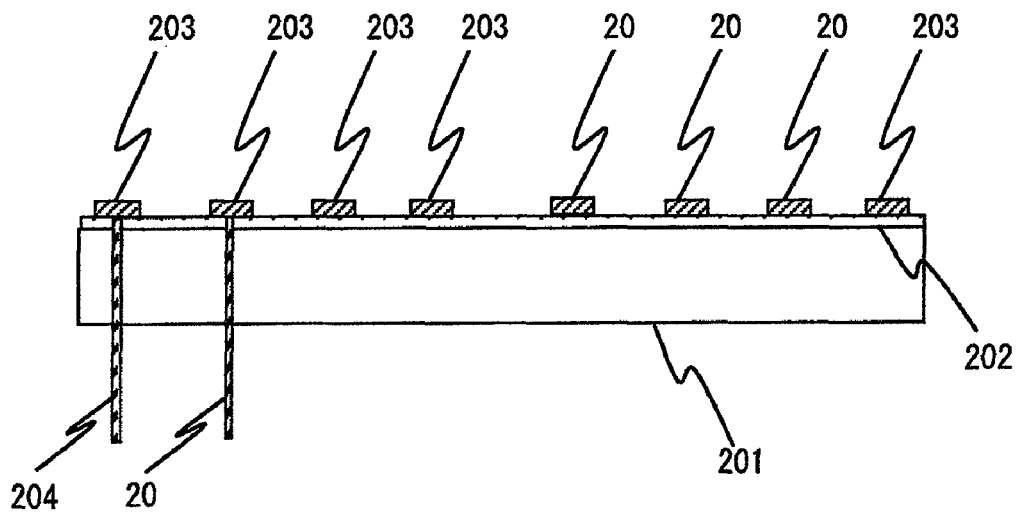
FIG. 2 is a vertically sectional view showing the condition of a process of manufacturing a sample stage shown in FIG. 1.

FIG. 2 shows a sectional view of the wafer stage during a temperature uniformizing process. Here, reference numeral 201 denotes an electrode main body. Reference numeral 202 denotes an insulating layer that electrically insulates the electrode main body from the spray coated film heater. The insulating layer 202 may be an insulating layer made of ceramics, which has an excellent insulating property, instead of a high-resistance dielectric film formed by spray coating. Reference numeral 203 denotes a metal spray coated film heater formed by spray coating. The shape of the spray coated film heater 203 may be precisely patterned by blasting, machining, or laser processing after spray coating of a metal material. Reference numeral 204 denotes electric feeding terminals used to energize the respective spray coated film heaters 203. The electric feeding terminals may be installed on a surface of the electrode main body which is other than a surface thereof for which heat generation is made uniform.

In the present embodiment, in the condition in FIG. 2, a voltage is applied to between the electric feeding terminals 204 to measure the circumferential heat generation distribution of the spray coated film heaters. In this case, the insulating layer and the layer of the spray coated film heaters 203 are mixed in the top surface, for which the heat generation distribution is measured. Thus, if the temperature distribution is measured using infrared rays, an emissivity setting needs to be checked and pre-corrected. Moreover, to measure the temperature distribution of the top surfaces of the spray coated film heaters 203 with high accuracy, it is desirable to apply a black tape or spray having a known emissivity to a measurement surface to fix the emissivity of a measurement target surface before measuring the temperature distribution. Furthermore, since the measurement using the infrared emission thermometer is likely to be affected by peripheral environments, the measurement is desirably performed in an environment that is unlikely to be affected by disturbance light. In this case, to measure the circumferential heat generation distribution, it is possible to determine the temperature distribution by placing a contact thermometer on each spray coated film heater 203 instead of using the non-contact emission thermometer.

Figure 3A:
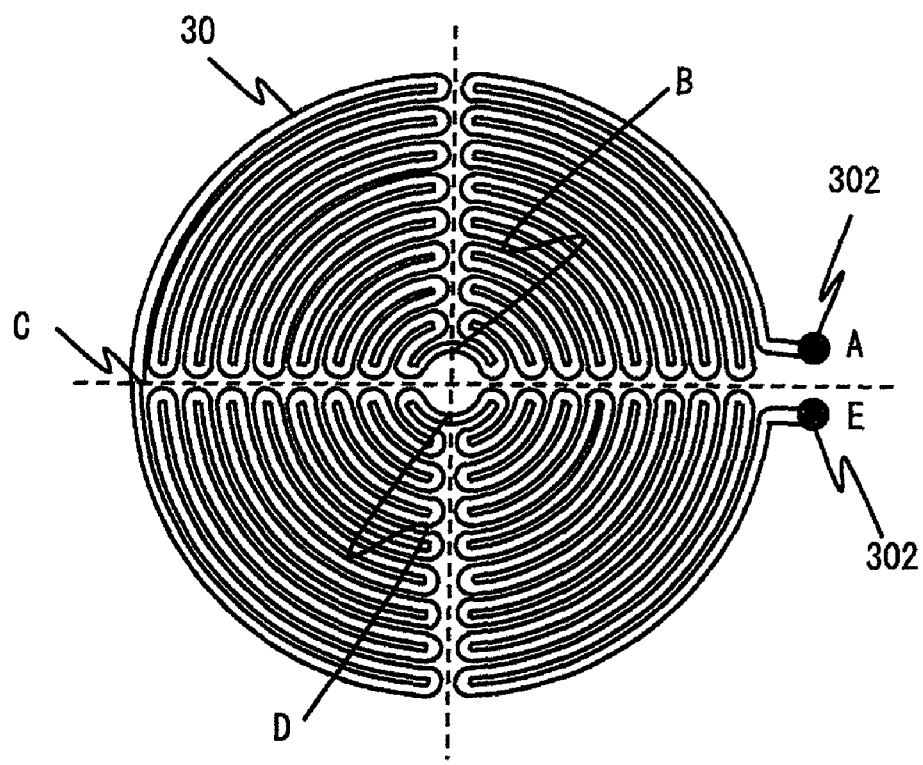
FIGS. 3A and 3B are schematic diagrams showing an example of the arrangement of heaters shown in FIG. 1 in the sample stage and an area in which a temperature distribution is detected or a resistance value is adjusted.
Figure 3B:
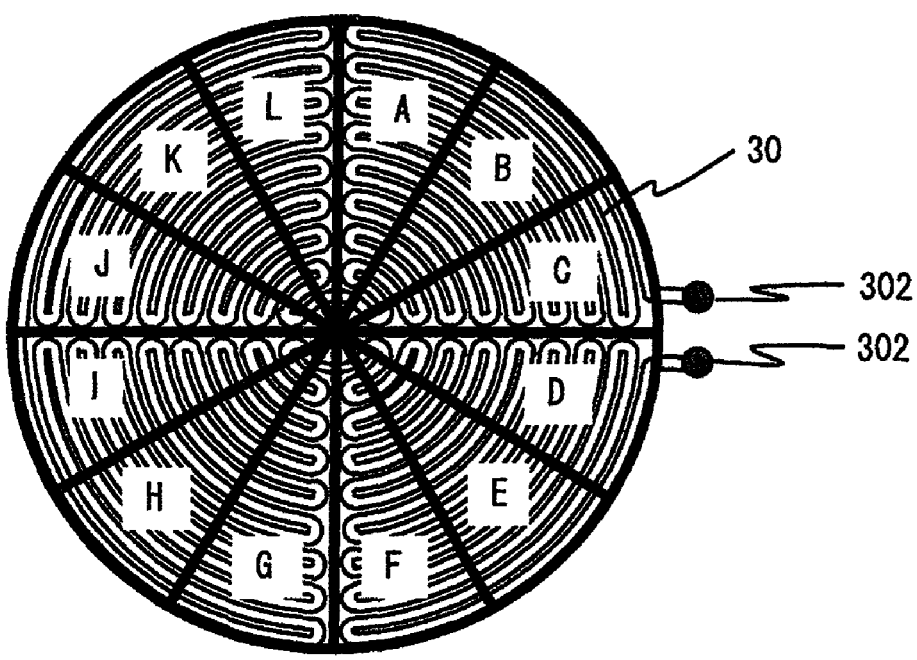

FIGS. 3A and 3B show an example of the planar structure of the spray coated film heater on the sample stage shown in FIG. 1. Reference numeral 301 denotes a spray coated film heater. Reference numeral 302 denotes electric feeding ends used to energize the spray coated film heater 301. This heater pattern shows one of the at least two heaters resulting from the division in the radial direction. FIG. 3A shows a position where the resistance value is measured. Each heater is divided into four blocks or areas A-B, B-C, C-D, and D-E in the circumferential direction for management. In the illustrated heater pattern, the heater is divided into at least three blocks in the circumferential direction according to the present invention. This enables the circumferential distribution of the resistance value to be determined by measuring the partial voltage of each block with a voltage of several voltages applied across the electric feeding terminals A and E.

FIG. 3B shows an example of a method for managing the circumferential temperature distribution. Heat generation from the spray coated film heater 301 is measured with the infrared emission thermometer. The heater is divided into 12 blocks A to L as shown in FIG. 3(b). The average temperature of each of the blocks is then calculated by image analysis to determine the initial circumferential temperature distribution observed when the spray coated film heater 301 was shaped. With the average temperature calculation blocks in FIG. 3, provided that the spray coated film heater 301 offers a uniform heat generation density and has uniform distributions of heat input and exhaust associated with external factors, a highly accurate in-plane temperature uniformity corresponding to a circumferential temperature distribution of ±0.5° C. can be accomplished by reducing a variation in resistance value to about 1 to 2%. Here, for the number of divisions for the average temperature, an increase in the number of blocks reduces the area for which the average temperature is calculated. This enables the temperature distribution within one block to be suppressed to allow a uniform temperature property to be precisely controlled in a circumferential direction.

Figure 4:
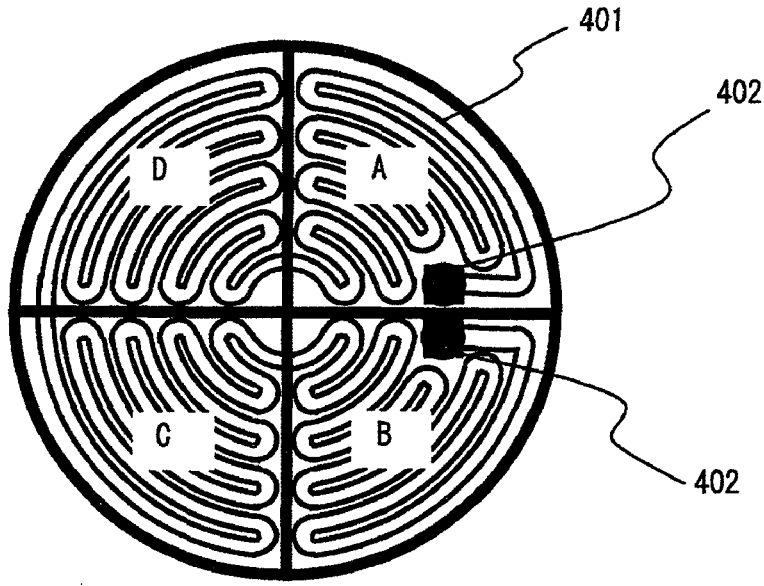
FIG. 4 is a schematic diagram showing an example of the planar structure of the heater having a specific point in the sample stage shown in FIG. 1.

A further advantage will be described with reference to FIG. 4. Reference numeral 401 denotes a spray coated film heater. Reference numeral 402 denotes electric feeding ends used to energize the spray coated film heater. In the example shown in FIG. 4, the resistance and the temperature distribution are managed by dividing the spray coated film heater into four areas A, B, C, and D. In this case, for the average temperature of the blocks A and B including the electric feeding ends 402, the electric feeding ends 402, which generate no heat, are included in the blocks A and B to reduce the heat generation density. This reduces the average temperature in these areas compared to that in the blocks C and D.

In the present embodiment, for a part of the spray coated film heater 401 in which the temperature is reduced by a difference in heat generation density as in the case of the blocks A and B, the quantity of heat generated can be adjusted by making the resistance value of the spray coated film heater 401 higher than that of the blocks C and D by several percents. The present embodiment is not limited to the case of nonuniform heat generation density. Although not shown in FIG. 1, the present embodiment makes it possible to intentionally increase the heat generation density of a local area in which the average temperature decreases in association with the structure of the electrode main body 101, such as the periphery of a wafer removing lift pin located inside the wafer placing electrode main body 101 or an introduction portion for a heat transferring gas fed to between the back surface of the wafer and the top surface of the high-resistance dielectric film 102 in order to cool the wafer. Moreover, for temperature distributions resulting from external factors, such as a heat exhaust distribution in the electrode main body 101 and a plasma heat input distribution during an etching process, if such a temperature distribution can be predicted during the manufacture of the spray coated film heater 401, the temperature uniformity can be obtained by adjusting the resistance to a predetermined value.

Here, the spray coated film heater 401 need not be shaped to have a fixed height or a fixed width. For the vicinity of a specific point where a low or high temperature portion may occur locally, the shape of the spray coated film heater, for example, the width thereof, may be locally controlled.

Figure 5:
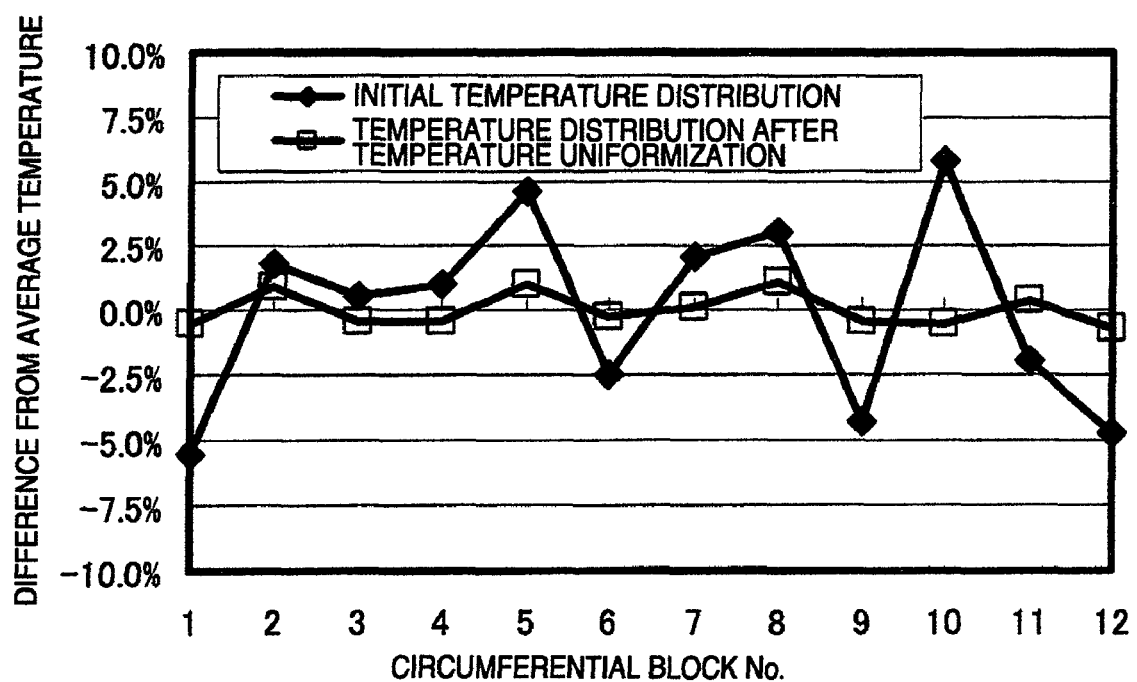
FIG. 5 is a graph showing an example of a circumferential temperature distribution observed before and after a process of adjusting resistance in a manufacturing method according to the embodiment shown in FIG. 1.

FIG. 5 is shows the circumferential temperature distribution of the spray coated film heater 401 observed before and after a temperature uniformizing process executed according to the present embodiment. FIG. 5 compares an initial circumferential heat generation distribution with a heat generation distribution obtained after adjustment based on the above-described technique. In the illustrated temperature uniformizing process for the spray coated film heater 401, the resistance value is managed by dividing the heater into four blocks in the circumferential direction. The temperature distribution is managed by dividing the heater into 12 blocks in the circumferential direction. The block names A to L are plotted on the axis of abscissa. Differences from the average temperature and from the circumferential average temperature for each block are plotted on the axis of ordinate.

As seen in FIG. 5, with the 12 blocks, the circumferential temperature distribution obtained before the adjustment of the quantity of heat generated exhibited a marked difference from the average temperature, that is, ±6%. For the resistance value distribution, a large value of ±9% was also exhibited. On the basis of the initial temperature distribution, an adjustment amount of resistance value of each block was calculated, and a target resistance value for the position corresponding to each temperature block was determined. The target resistance value according to the present embodiment was a circumferential distribution of at most 0.5%. In the present embodiment, on the basis of the block J, exhibiting the highest temperature in the initial temperature distribution, the blocks generating only small quantities of heat were polished and ground. For the adjustment of the quantity of heat generated, the heat uniformity can also be improved by increasing the number of spray coated film heaters 401 in the blocks generating large quantities of heat on the basis of the block A, exhibiting the lowest temperature in the initial temperature distribution. As seen in FIG. 5, in the present embodiment, a high heat uniformity corresponding to a difference of 1% from the average temperature was accomplished as a result of the adjustment of the heat generation quantity with the target resistance value set to a circumferential distribution of at most 0.5% and with the blocks corresponding to the low-temperature areas subjected to the polishing and grinding process in the circumferential direction.

According to the above-described embodiment, even with spray coated film heaters composed of a spray coated film offering only a low reproducibility and preventing the resistance value from being easily controlled, a highly accurate in-plane temperature uniformity corresponding to a circumferential temperature distribution of ±1% is ensured. Furthermore, since the spray coated film heater is divided into at least two pieces in the radial direction, the temperature distribution of the sample surface can be varied by fine-tuning the heaters inside the electrode. This makes it possible to control not only a decrease in the temperature accuracy attributed to the heat generation distribution of the heaters but also a decrease in temperature accuracy associated with the structure of the wafer placing electrode or an external factor such as a plasma heat input distribution. This in turn makes it possible to precisely control the temperature distribution of the surface of the sample installed on the wafer placing electrode, enabling a reduction in damage to the wafer or wafer etching errors associated with the nonuniform temperature. Therefore, effects such as an increase in throughput and a reduction in costs are expected.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A manufacturing method of a plasma processing apparatus comprising a sample stage located in a processing chamber in which plasma is generated, the sample stage having a wafer mounting surface on a top surface thereof on which the wafer is mounted, a film made of a dielectric material and located on the wafer mounting surface of the sample stage, and a film-like heater arranged inside the film made of the dielectric material, the plasma processing apparatus executing plasma processing while using the film-like heater to heat the wafer placed on the wafer surface, the method comprising the steps of:

forming a first layer of the film made of the dielectric material on the top surface of the sample stage, forming the film-like heater on the first layer of the film made of the dielectric material, the film-like heater being constituted by spray coating a metal material on the first layer of the film in a radial and circumferential direction with predetermined widths, supplying power to the film-like heater to detect a temperature distribution on a plane of the top surface of the sample stage, adjusting a shape of the film-like heater on the basis of a result of the detection of the temperature distribution to adjust a resistance value of the film-like heater so that the temperature distribution has a predetermined value, and forming a second layer of the film made of the dielectric material on the film-like heater so that the film-like heater is disposed within the first and second layers of the film made of the dielectric material.

2. The manufacturing method in the plasma processing apparatus according to claim 1, wherein the temperature distribution is detected using a noncontact surface thermometer.

3. The manufacturing method in the plasma processing apparatus according to claim 1, wherein the step of adjusting the shape of the film-like heater includes reducing the cross section of the film-like heater corresponding to a low temperature portion of the temperature distribution.

4. The manufacturing method in the plasma processing apparatus according to claim 1, wherein the step of adjusting the shape of the film-like heater includes increasing the cross section of the film-like heater corresponding to a high temperature portion of the temperature distribution.

5. The manufacturing method in the plasma processing apparatus according to claim 1, wherein the heater is divided into at least three areas in a circumferential direction of the surface on which the wafer is mounted, a distribution of the resistance value of the heater is detected, and the resistance value of the heater is adjusted for each of the areas.

6. The manufacturing method in the plasma processing apparatus according to claim 2, wherein the heater is divided into at least three areas in a circumferential direction of the surface on which the wafer is mounted, a distribution of the resistance value of the heater is detected, and the resistance value of the heater is adjusted for each of the areas.

7. The manufacturing method in the plasma processing apparatus according to claim 3, wherein the heater is divided into at least three areas in a circumferential direction of the surface on which the wafer is mounted, a distribution of the resistance value of the heater is detected, and the resistance value of the heater is adjusted for each of the areas.

8. The manufacturing method in the plasma processing apparatus according to claim 5, wherein the resistance value is adjusted on the basis of an average temperature distribution of each of the areas.

* * * * *